US012585185B2

(12) United States Patent
Hajibabaeinajafabadi et al.

(10) Patent No.: US 12,585,185 B2
(45) Date of Patent: Mar. 24, 2026

(54) ACID FOR REACTIVE DEVELOPMENT OF METAL OXIDE RESISTS

(71) Applicant: Tokyo Electron Limited, Tokyo (JP)

(72) Inventors: Hamed Hajibabaeinajafabadi, Albany, NY (US); Akiteru Ko, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 738 days.

(21) Appl. No.: 17/871,444

(22) Filed: Jul. 22, 2022

(65) Prior Publication Data

US 2024/0027900 A1       Jan. 25, 2024

(51) Int. Cl.
  *G03F 7/004*       (2006.01)
  *G03F 7/32*        (2006.01)
  *G03F 7/40*        (2006.01)
  *G03F 7/42*        (2006.01)

(52) U.S. Cl.
  CPC ............ *G03F 7/0043* (2013.01); *G03F 7/325* (2013.01); *G03F 7/40* (2013.01); *G03F 7/426* (2013.01)

(58) Field of Classification Search
  None
  See application file for complete search history.

(56) References Cited

U.S. PATENT DOCUMENTS 11,079,682 B1 *   8/2021   Han .................... H01L 21/0337
2003/0148209 A1 *  8/2003   Fujita ................... G03F 7/0382
                                            430/164

2013/0323645 A1    12/2013   Komuro et al.
2021/0364924 A1 *  11/2021   Liu .......................... G03F 7/325
2022/0020584 A1 *   1/2022   Volosskiy .............. G03F 7/167

FOREIGN PATENT DOCUMENTS

WO      20200132281 A1      6/2020
WO       2020264158 A1     12/2020
WO       2022016123 A1      1/2022
WO      WO-2022125388 A1 *  6/2022   ............. G03F 7/167

OTHER PUBLICATIONS

Mendez et al ( Mariano Méndez, Andres Cedillo, Gas phase Lewis acidity and basicity scales for boranes, phosphines and amines based on the formation of donor-acceptor complexes, Computational and Theoretical Chemistry, vol. 1011, 2013, pp. 44-56, ISSN 2210-271X, (Year: 2013).*

(Continued)

*Primary Examiner* — Jonathan Johnson
*Assistant Examiner* — Andrew Preston Traywick
(74) *Attorney, Agent, or Firm* — Slater Matsil, LLP

(57)       ABSTRACT

A method of reactive developing a metal oxide resist includes providing a gaseous weak acid to a surface of a patterned metal oxide resist including an exposed portion and an unexposed portion, the gaseous weak acid having an acidity ($pK_a$) greater than −2 and less than about 20, and reactive developing the patterned metal oxide resist using a selective acid-base reaction between the gaseous weak acid and the patterned metal oxide resist to form volatile products. The gaseous weak acid acts as the acid and either the exposed portion or the unexposed portion acts as the base.

20 Claims, 5 Drawing Sheets

(101)

(102)

(103)

(56) References Cited

OTHER PUBLICATIONS

Burdett et al (Keto-Enol Tautomerism in β-Dicarbonyls Studied by Nuclear Magnetic Resonance Spectroscopy.1 I. Proton Chemical Shifts and Equilibrium Constants of Pure Compounds, Jane L. Burdett and Max T. Rogers, Journal of the American Chemical Society 1964 86 (11), 2105-2109) (Year: 1964).*
W. M. Haynes.; David R. Lide; Thomas J. Bruno, eds. (2016-2017). CRC Handbook of Chemistry and Physics. CRC Press. pp. 963 (Year: 2017).*
International Searching Authority, "Notification of Transmittal of the International Search Report and the Written Opinion of the International Searching Authority,or The Declaration," International application No. PCT/US2023/027671, Oct. 31, 2023, 12 pages.

* cited by examiner (101)

(102)

(103)

200

300

400

500

600

601 provide a gaseous weak acid to a surface of a patterned metal oxide resist (MOR) comprising an exposed portion and an unexposed portion, the gaseous weak acid having an acidity (pK$_a$) greater than −2 and less than about 20

602 dry develop the patterned MOR using a selective acid-base reaction between the gaseous weak acid and the patterned MOR to form volatile products, the gaseous weak acid acting as the acid and either the exposed portion or the unexposed portion acting as the base

701 provide a gaseous developer to a surface of a patterned metal oxide resist (MOR) comprising an exposed portion and an unexposed portion, the gaseous developer comprising an at least partially substituted form of a compound selected from the group consisting of a hydroxyl-containing compound having the formula RO—H with R being an organic group or hydrogen, an aromatic alcohol having the formula ArO—H with Ar being an aromatic compound, an amine having the formula RN—H, and a borane

702 dry develop the patterned MOR using a selective acid-base reaction between the gaseous weak acid and the patterned MOR to form volatile products, the gaseous developer acting as the acid and either the exposed portion or the unexposed portion acting as the base.

*FIG. 7*

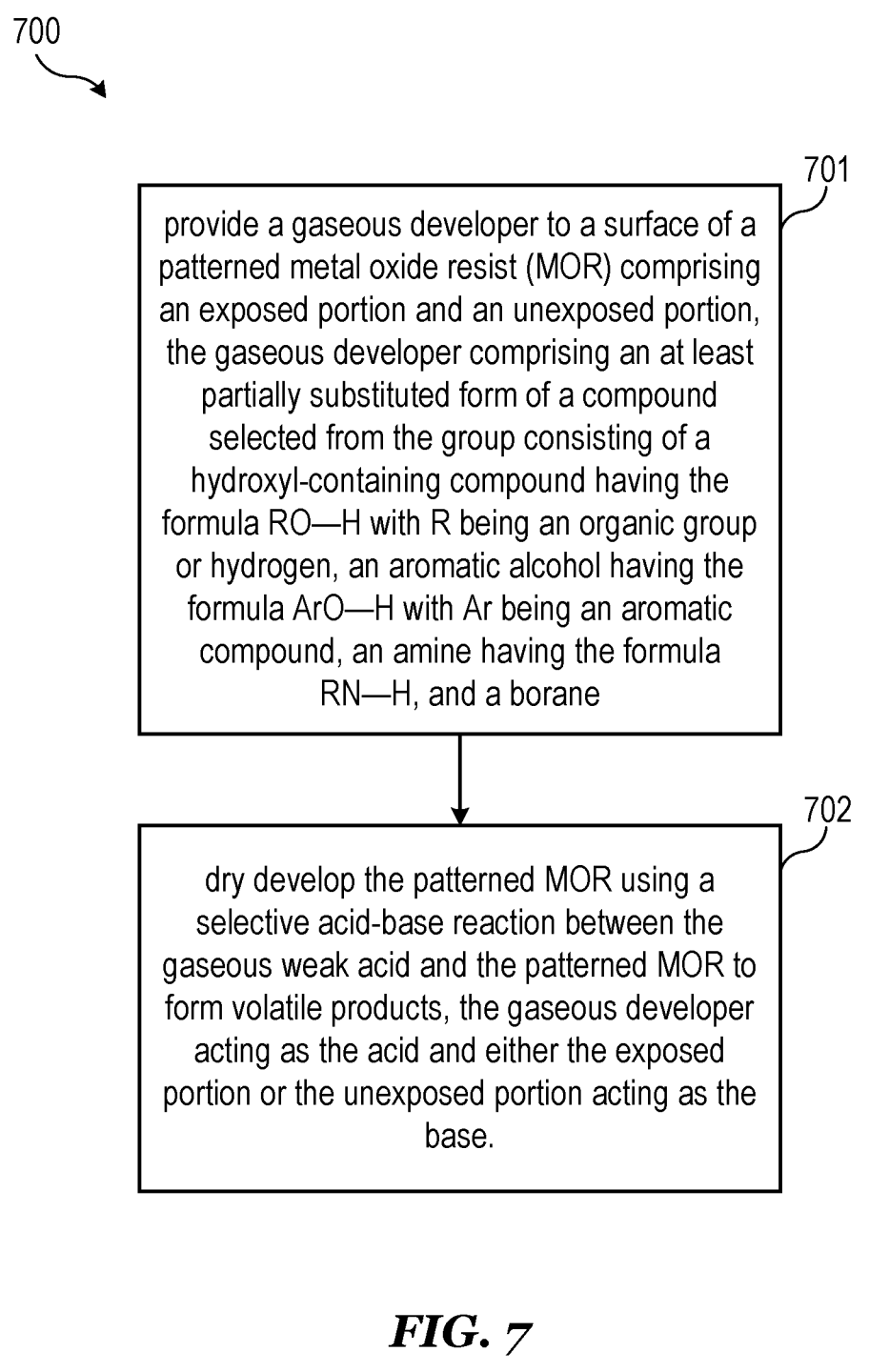

ACID FOR REACTIVE DEVELOPMENT OF METAL OXIDE RESISTS

TECHNICAL FIELD

The present invention relates generally to systems and methods for reactive development of photoresist, and, in particular embodiments, to systems and methods utilizing an acid for reactive development of metal oxide resists.

BACKGROUND

Device fabrication of semiconductor devices may involve a series of manufacturing techniques such as formation, patterning, and removal of a number of layers of material on a substrate. There is a consistent and continuous push to improve the fabrication processes, features, and capabilities of semiconductor devices. These improvements may require new chemistry development as well as new advanced methods for process control.

One common manufacturing technique used for patterning material on a substrate is photolithography. During the photolithography process, a layer of photoresist is exposed to electromagnetic radiation of a particular wavelength to effect a change in the sensitivity of the exposed region to a development process. The electromagnetic radiation may include visible light, but now often includes shorter wavelength light such as ultraviolet (UV) deep ultraviolet (DUV), and extreme ultraviolet (EUV) light. In order to create a pattern in the photoresist, a lithography mask is placed between the light source and the substrate.

A development process is used to remove either the exposed regions (positive tone resist) or the unexposed regions (negative tone resist) of the photoresist while leaving the remaining regions. The resulting photoresist pattern on the substrate is often used as an etch mask to transfer the pattern to the underlying substrate. The photoresist may be developed using a wet development process involving a solvent or a reactive development process (e.g. including but not limited to so-called "dry" development process) involving a mixture of gases.

Metal oxide resist (MOR) have been used in high resolution patterning applications such as EUV lithography. Wet development of MOR films is prone to capillary-induced feature collapse at fine pitch and has low throughput due to being developed in a solvent and dried using a track tool.

Reactive development of MOR films prevents feature collapse and has higher throughput. However, the chemistry of reactive development of MOR is not well-understood. Current compounds used to reactively develop MOR films rely on highly corrosive inorganic compounds such as HBr. These compounds are also very aggressive which reduces selectivity, imposing serious consideration and challenges for processing tool designing and manufacturing. As a result, current techniques for reactive development of MOR films require thicker films and residue remains after the reactive development process, which results in reduced throughput. Therefore, improved compounds for use in reactive developing MOR films is desirable.

SUMMARY

In accordance with an embodiment of the invention, a method of reactive developing a metal oxide resist includes providing a gaseous weak acid to a surface of a patterned metal oxide resist including an exposed portion and an unexposed portion, the gaseous weak acid having an acidity ($pK_a$) greater than −2 and less than about 20, and reactive developing the patterned metal oxide resist using a selective acid-base reaction between the gaseous weak acid and the patterned metal oxide resist to form volatile products. The gaseous weak acid acts as the acid and either the exposed portion or the unexposed portion acts as the base.

In accordance with another embodiment of the invention, a method of reactive developing a metal oxide resist includes providing a gaseous developer to a surface of a patterned metal oxide resist including an exposed portion and an unexposed portion. The gaseous developer includes an at least partially substituted form of a compound selected from the group consisting of a carboxylic acid having the formula RCOO—H with R being an organic group or hydrogen, an alcohol having the formula RO—H, an aromatic alcohol having the formula ArO—H with Ar being an aromatic compound, an amine having the formula RN—H, and a borane. The method further includes reactive developing the patterned metal oxide resist using a selective acid-base reaction between the gaseous developer and the patterned metal oxide resist to form volatile products. The gaseous developer acts as the acid and either the exposed portion or the unexposed portion acts as the base.

In accordance with still another embodiment of the invention, an integrated baking and reactive development apparatus includes a vacuum chamber coupled to a pumping system, a hot plate configured to bake a substrate including a patterned metal oxide resist, and a gas inlet configured to supply a gaseous developer to develop the patterned metal oxide resist at a pressure greater than about 1 mTorr. The vacuum system includes a positive displacement pump, but includes no momentum transfer pump or entrapment pump.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 illustrates a method of reactive developing a metal oxide resist in accordance with embodiments of the invention; and FIG. 7 illustrates another method of reactive developing a metal oxide resist in accordance with embodiments of the invention.

Figure 1:
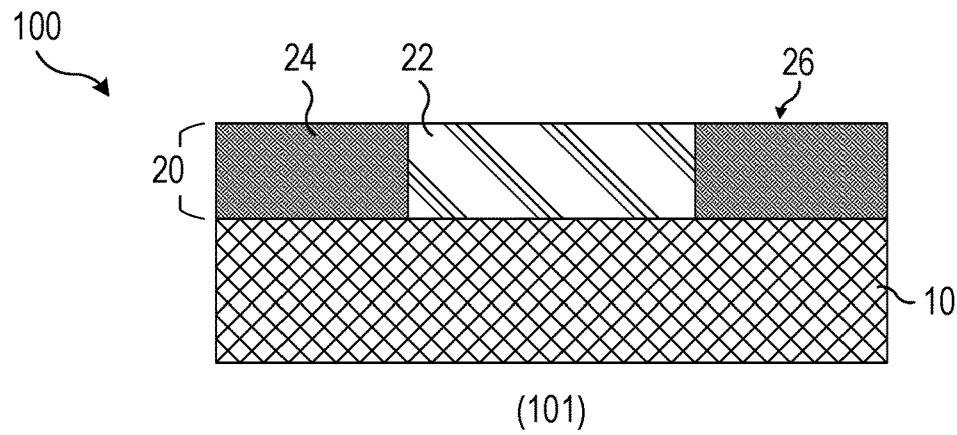
FIG. 1 illustrates an example process of reactive developing a metal oxide resist using a reactive developer including a gaseous weak acid in accordance with embodiments of the invention.
Figure 1:
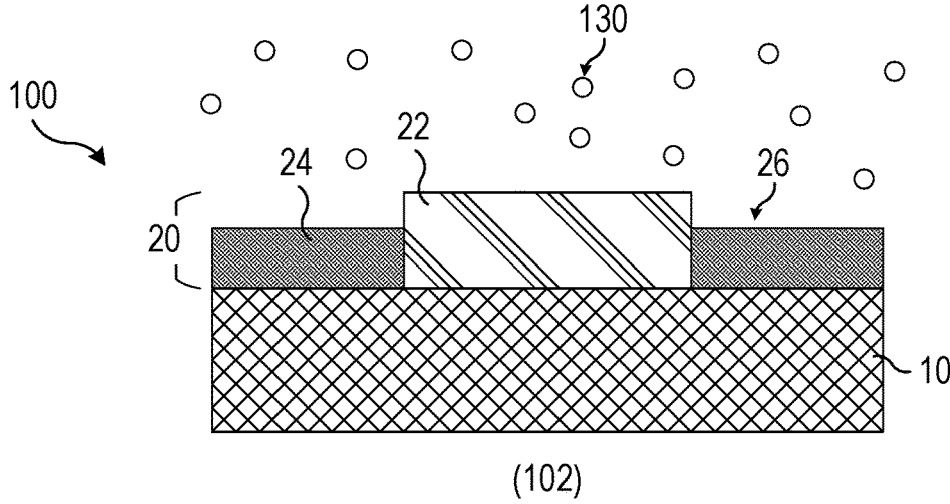
Figure 1:
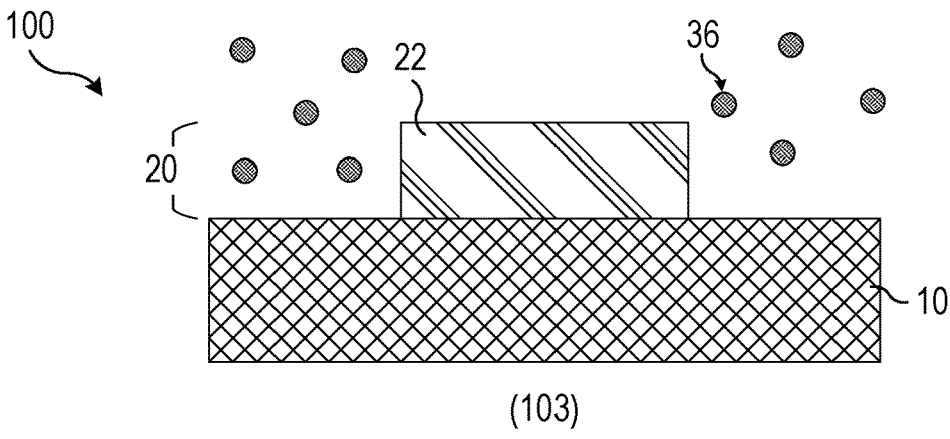

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Conventional reactive development of MOR films are highly aggressive which presents challenges for tool design and decreases selectivity resulting in thicker resist requirements and higher cost. Moreover, while conventional reactive development processes have many advantages over conventional wet development processes, the reactive development remains incomplete leaving a residue that is not present in the wet development.

Conventional understanding of reactive development processes lead to the selection of reactive developers with strong acidity. The conventional reactive development compounds in use are largely inorganic acids such as mineral acids. Halides are frequently thought of as being crucial to conventional reactive development processes which call for halide-based etchants. Yet these conventions result in the performance shortcomings of conventional reactive development processes since conventionally selected reactive developers are too aggressive. Moreover, the highly corrosive conventional reactive development compounds are difficult to handle and require strict design requirements for tooling.

Low selectivity is a major drawback of conventional reactive developers. For example, due to the aggressive nature of the reactive development compounds, selectivity is largely statistical and relies on the higher density and the film structure making oxygen atoms less accessible to cause a difference in the reaction rate of the conventional reactive developer with exposed portions of the MOR film compared to unexposed portions.

The low selectivity is compensated by tightly controlling process conditions such as temperature, pressure, gas flow-rates, development time, plasma activation, and resist thickness. This in turn disadvantageously leads to tighter processing windows. And despite tight process tuning, conventional reactive developers still do not completely develop (i.e. remove) desired portions of the MOR film leaving an undesirable residue.

The inventors have discovered that the development chemistry at the surface of the patterned MOR is an acid-base reaction that does not require a strong acid to be effective. Rather, the inventors have determined that weak acids are also able to reactively develop MOR films due to the reaction dependence on the acidity of the reactive development compound. For example, tuning the acidity of the reactive developer can improve the selectivity of the reaction and alter the reaction rate through a process of selective protonation of the MOR material being removed.

The embodiment MOR reactive development processes described herein may improve selectivity to the MOR material being removed (e.g. unexposed portions for a negative tone resist). This increase in selectivity in turn may offer various advantages afforded by expanded process windows. For example, thinner MOR films may be possible with advantageously lowers cost (photoresist can be a disproportionately expensive component of the process flow) and improves throughput due to less time spent exposing and developing the MOR film. Improved selectivity may also have the benefits of improving feature profile, yield, and allow complete development of the patterned MOR resulting in little or no residue (similar to wet development processes).

The embodiments described herein may also have the advantage of enabling reactive development at higher pressure and temperature. These pressure and temperature ranges may advantageously coincide much more closely to process conditions in baking steps before and/or after the reactive development step. This may allow large increases in throughput by performing baking and reactive development in the same tool, at similar pressure, and/or at similar temperature.

The broadening of the available temperature range and pressure range may be a result of the improved selectivity. For instance, increases in selectivity may slow the reaction rate compared to conventional reactive development reaction rates. Since reaction rate may increase with increased temperature and pressure, a slower reaction rate may advantageously allow both temperature and pressure to be increased.

Additionally, the embodiments described herein may be less corrosive. This may have the benefit of allowing some requirements of tool design and operation to be relaxed compared to the strict requirements of conventional reactive developers.

Embodiments provided below describe various systems and methods for reactive development of photoresist, and in particular, to systems and methods utilizing a relatively weak acid for reactive development of a MOR. The following description describes the embodiments. FIG. 1 is used to describe an embodiment process of reactive developing a MOR. Several embodiment reactive developers including a gaseous weak acid are described using FIGS. 2 and 3. An embodiment reactive development apparatus is described using FIG. 4 while FIG. 5 is used to describe an embodiment lithography process flow that may be performed in the reactive development apparatus. Two embodiment methods of reactive developing a MOR are described using FIGS. 6 and 7.

FIG. 1 illustrates an example process of reactive developing a MOR using a reactive developer including a gaseous weak acid in accordance with embodiments of the invention.

Referring to FIG. 1, a process 100 of reactive developing a MOR begins with a patterned MOR 20 with a surface 26 to be developed as shown in step 101. The patterned MOR 20 may be disposed on a substrate 10 (e.g. a semiconductor substrate with any suitable arrangement of layers and materials). The patterned MOR 20 may be patterned using photolithographic techniques to form an exposed portion 22 and an unexposed portion 24. For example, the photolithographic techniques may be visible light photolithography, UV lithography, DUV lithography, EUV lithography, and the like. In one embodiment, the patterned MOR 20 is formed by exposing a MOR film to EUV light.

The patterned MOR 20 may be any suitable MOR. For example, the MOR includes an elemental metal such as tin (Sn), zinc (Zn), zirconium (Zr), indium (In), hafnium (Hf), bismuth (Bi), and others or an elemental metalloid such as germanium (Ge), antimony (An), and tellurium (Te). The MOR may form oxides when exposed to oxygen. The MOR also includes one or more moieties that facilitate photosensitivity. For example, the MOR may include organic moieties such as alkyl groups that decrease the density of the MOR prior to exposure. In one embodiment, the MOR includes Sn. In another embodiment, the MOR includes Hf. In various embodiments, the MOR includes an alkyl group with at least two carbons. In one embodiment, the alkyl group is a propyl group. In another embodiment, the alkyl group is a butyl group. The MOR resist can be deposited via various deposition techniques, to wet and/or vacuum deposition, including but not limited to spin coating, atomic layer deposition (ALD), molecular layer deposition (MLD), chemical vapor deposition (CVD), and the like.

Step 102 of the process 100 is providing a reactive developer including a gaseous weak acid 130 to the surface 26 of the patterned MOR 20. As shown in step 102 the gaseous weak acid 130 begins to develop the patterned MOR 20 by selectively reacting with the unexposed portion 24 while reacting minimally with the exposed portion 22. The gaseous weak acid 130 selectively etches the unexposed portion 24 relative to the exposed portion 22. For example, the gaseous weak acid 130 may only slowly etch the exposed portion 22, passivate the exposed portion 22, or not react with the exposed portion 22.

In the presence of the gaseous weak acid 130, the patterned MOR 20 is reactive developed in step 103 using a selective acid-base reaction between the gaseous weak acid 130 and the patterned MOR 20 to form volatile products 36 that are removed from the substrate 10. During the selective acid-base reaction, the gaseous weak acid 130 acts as the acid and the unexposed portion 24 acts as the base. In this example, the MOR is a negative tone resist (i.e. the unexposed portion 24 is removed during development). However, the MOR may also be a positive tone resist where the exposed portion 22 is removed. In this alternative scenario, the exposed portion 24 would act as the base during the selective acid-base reaction.

The gaseous weak acid 130 may have improved selectivity to the unexposed portion 24 relative to the exposed portion 22 compared to conventional reactive development techniques which use strong acid compounds. This improved selectivity may have the benefit of expanding processing windows for various process parameters such as temperature and pressure. For example, step 103 of reactive developing the patterned MOR 20 may be performed in a processing chamber at a pressure greater than about 1 mTorr (e.g. in the medium vacuum regime between about 1 mTorr and about 1 Torr, in the low vacuum regime between about 1 Torr and about 500 Torr, or higher such as at atmospheric pressure).

Whereas some conventional reactive development processes require a plasma, the step 103 of reactive developing the patterned MOR 20 may advantageously be a thermal process performed in a processing chamber with no plasma generated in the processing chamber. In some cases, the step 103 of reactive developing the patterned MOR 20 may advantageously be a thermal process performed in a processing chamber using a gaseous weak acid that has been activated using a remote plasma generated in a precursor chamber coupled to the processing chamber. However, it should be noted that it may also be desired in other situations for the step 103 of reactive developing the patterned MOR 20 to include generating a plasma in the processing chamber.

The temperature process window of the step 103 of reactive developing the patterned MOR 20 may be advantageously increased by the improved selectivity of the gaseous weak acid 130. For example, the reactive development of the patterned MOR 20 may be performed at any desired temperature within the range of about −70° C. to about 400° C. This contrasts with conventional reactive development techniques which are often restricted to more moderate temperatures (e.g. greater than 0° C. and less than 300° C. or even narrower temperature ranges). For this reason, a potential advantage of the gaseous weak acid 130 is facilitating reactive development at more extreme temperatures. For example, in one embodiment, the reactive development of the patterned MOR 20 is performed at a temperature greater than 300° C. and less than about 400° C. In another embodiment, the reactive development of the patterned MOR 20 is performed at a temperature less than 0° C. and greater than about −70° C.

Another potential advantage of the expanded processing windows of the gaseous weak acid 130 is to allow optional baking steps to be performed in the same processing chamber as the reactive development of the patterned MOR 20. These baking steps may include a post exposure bake (PEB) before reactive developing the patterned MOR 20 and/or a post development bake (PDB) after reactive developing the patterned MOR 20.

In some application, an optional additional reactive development step may be performed after step 103. For example, step 103 may be performed such that some of the unexposed portion 24 remains or there may be other residue remaining. The optional additional reactive development step may be used to complete the reactive development of the patterned MOR 20.

The optional additional reactive development step may use a different gaseous weak acid, different mixture of compounds including a weak acid, or incorporate a gaseous strong acid. In some embodiments, the optional additional reactive development step includes reactive developing the patterned MOR 20 using a gaseous strong acid. For example, the gaseous strong acid may be a mineral acid, such as HBr, for example. The strong acid may be more aggressive (e.g. less selective to the unexposed portion 24) but may etch faster or provide other benefits after a significant amount of the unexposed portion 24 has been removed in the weak acid reactive development step 103.

The reactive developer including the gaseous weak acid 130 may be provided at the surface 26 through any suitable means. For example, the reactive developer and the gaseous weak acid 130 may be injected into a processing chamber containing the substrate 10 and the patterned MOR 20. The gaseous weak acid 130 may also be activated or generated within the processing chamber. For instance, the gaseous weak acid 130 may be generated in the processing chamber from a precursor that has been injected into the processing chamber. The gaseous weak acid 130 may also be supplied continuously throughout the reactive development process or discontinuously (e.g. pulsed periodically or in any pattern desirable for a particular application).

Figure 2:
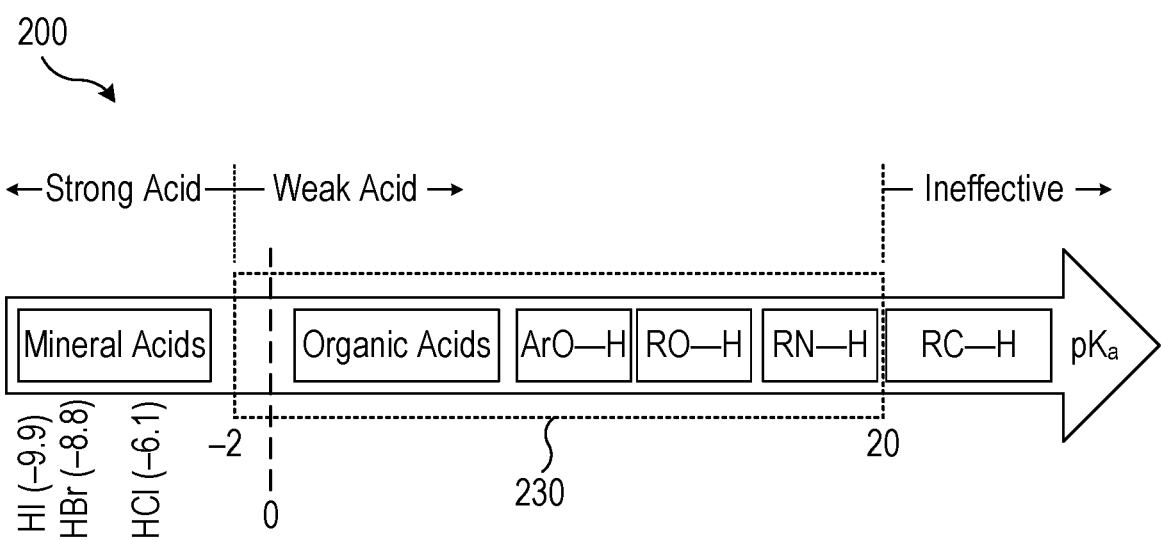
FIG. 2 illustrates example gaseous weak acids in accordance with embodiments of the invention.

FIG. 2 illustrates example gaseous weak acids in accordance with embodiments of the invention. The gaseous weak acids of FIG. 2 may be a specific implementation of other gaseous weak acids described herein such as the gaseous weak acids of FIG. 1, for example. Similarly labeled elements may be as previously described.

Referring to FIG. 2, a qualitative chart 200 shows various classes of acidic compounds placed along an acidity continuum as measured by the acid dissociation constant $pK_a$. The acidic compounds can be divided into two general groups: strong acids and weak acids (e.g. based on effectively complete dissociation in a solvent such as water). Strong acids may be defined as having a $pK_a$ less than about −2.

Conventional reactive developers include a gaseous strong acid such as a mineral acid containing a halide (e.g. HBr). As noted above, the inventors have discovered that the reactive development reaction mechanism is an acid-base reaction that can be made more selective by utilizing a gaseous weak acid (i.e. with $pK_a$ greater than −2). The inventors have also discovered that the reactive developer becomes practically ineffective for $pK_a$ values above a certain threshold (i.e. $pK_a$ values greater than about 20). This results in a useful range of $pK_a$ values for reactive development of patterned MOR films from −2 to about 20 from which a gaseous weak acid 230 can be selected. It should be mentioned that not all mineral acids are strong acids under this definition. For example, hydrogen fluoride (HF) is a weak acid with a $pK_a$ of about 3.5 and may be used as a gaseous weak acid 230 in some embodiments.

It should be noted that here and in the following a convention has been adopted for brevity and clarity wherein elements adhering to the pattern [x30] may be related implementations of a gaseous weak acid in various embodiments. For example, the gaseous weak acids 230 may be similar to the gaseous weak acid 130 except as otherwise stated. An analogous convention has also been adopted for other elements as made clear by the use of similar terms in conjunction with the aforementioned three-digit numbering system.

The inventors have identified several classes of weak acids suitable for use as a reactive developer for patterned MOR films that have acidity falling in the range $-2 < pK_a \leq$ about 20 (as well as having other desirable properties). These include hydroxyl-containing compounds including an O—H group, such as carboxylic acids having a formula of RCOO—H with R being an organic group (e.g. saturated, unsaturated, aromatic, etc.) or hydrogen, alcohols having the formula RO—H (including the specific instance of aromatic alcohols ArO—H with Ar being an aromatic compound), and amines having the formula RN H. Other compounds may also include thiols having the formula RS—H, amino acids having the formula R—CH(NH$_2$)COOH, nitriles having the formula R—CN (such as hydrocyanic acid, HCN where R is hydrogen or any of the acids having the chemical formula HOCN, such as cyanic/isocyanic acid), HSCN (such as thiocyanic/isothiocyanic acid), hydrogen sulfide (H$_2$S), hydrogen selenide (H$_2$Se), and others. The number of carbon atoms in the R group may vary depending on the details of a given application. In some embodiments, the number of carbon atoms is in the range of 1 to 11 carbon atoms.

Each class of compounds is shown on the qualitative chart 200 as having a range of $pK_a$ values typical of the class (although not necessarily reflective of the entire set of such compounds). An example class of compounds that generally fall outside the suitable $pK_a$ range include carbon-containing compounds having the formula RC—H.

In addition to the compounds belonging to these groups having various $pK_a$ values, each compound may also be substituted with substituents of different electronegativities and electron withdrawing that may alter than $pK_a$ of the unsubstituted compound. For example various electron withdrawing groups such as F, Cl, Br, I, CF$_3$, CN, NO$_2$ can be used as a substituent. In addition, the steric effect can further be utilized to impact both the $pK_a$ of developing gas and also tune the feasibility of overall reaction between developing gas and MOR. In this way, the acidity of the compounds may be tailored to achieve even better selectivity and afford greater flexibility in the choice of the gaseous weak acid 230. For example, the class of aromatic alcohols can be advantageously tailored to have a $pK_a$ from about −1 to about 11. Similarly, simple alcohols (in the class of hydroxyl-containing compounds) can be tailored to have a $pK_a$ from about 10 to about 15.

In various embodiments, the gaseous weak acid 230 is a hydroxyl-containing compound, an aromatic alcohol, or an amine, and is substituted with a more electronegative substituent. For example, the more electronegative substituent is may be a halogen. One particular example of this is the compound acetylacetone (acac) which has the formula CH$_3$C(OH)=CHC(O)CH$_3$ (the enol tautomer comprising 85% of an acac solution) and thus falls into the hydroxyl-containing class of compounds. The compound acac has a $pK_a$ of about 8.75. However, by substituting the hydrogens with fluorine, the compound becomes hexafluoroacetylacetone (hfac) which has the formula CF$_3$C(OH)=CHC(O)CF$_3$ and a lower $pK_a$ of about 5.35.

This concept can be applied to the other classes of compounds as well. For example, the gaseous weak acid 230 may be an at least partially substituted simple alcohol with at least one halogen substituent. One example of this would be a fluorinated ethanol such as trifluoroethanol. Another example would be a fluorinated propanol such as hexafluoroisopropanol.

Figure 3:
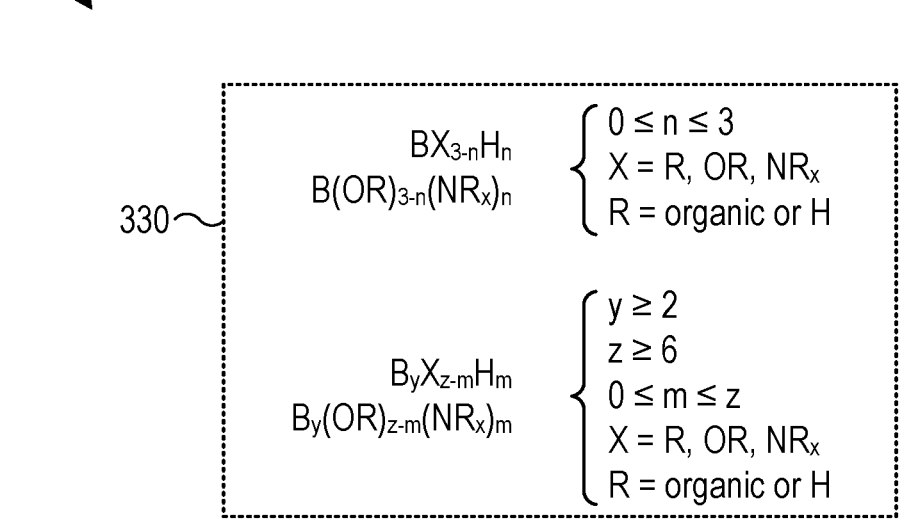
FIG. 3 illustrates example gaseous weak acids that are each Lewis acids comprising boron in accordance with embodiments of the invention.

FIG. 3 illustrates example gaseous weak acids that are each Lewis acids comprising boron in accordance with embodiments of the invention. The gaseous weak acids of FIG. 3 may be a specific implementation of other gaseous weak acids described herein such as the gaseous weak acids of FIG. 1, for example. Similarly labeled elements may be as previously described.

Referring to FIG. 3, a table 300 shows various classes of Lewis acids comprising boron from which a gaseous weak acid 330 may be chosen. As compared to conventional reactive developers that use boron (e.g. BH$_3$, BCl$_3$) the gaseous weak acids 330 have a lower acidity (e.g. between −2 and about 20). In various embodiments, the gaseous weak acid 330 is a Lewis acid comprising boron (e.g. B$_y$X$_{z-m}$H$_m$ with y≥1, z≥3, 0≤m≤z) and at least one organic substituent X from the group consisting of an alkyl group having the formula C$_n$H$_{2n+1}$ with n>0, an alkoxide group having the formula OR with R being an organic group or hydrogen, and an amide group having the formula NR$_x$ with x>0.

This includes Lewis acids that are partially substituted. For example, the gaseous weak acid 330 may be a Lewis acid comprising a boron-hydrogen bond and at least one alkyl, alkoxide, or amide substituent. The gaseous weak acid 330 may also be a substituted or unsubstituted Lewis acid comprising a higher order borane having the formula B$_y$H$_z$ with y>1 and z>3. Some examples of higher order boranes are diborane (B$_2$H$_6$), tetraborane (B$_4$H$_{10}$), pentaborane (B$_5$H$_9$) and so on. The developing gas can also be a mixture of the aforementioned acids with different concentrations, where each component serves a specific role. One specific non-limiting example is a developing gas that has several acidic groups attached to a single molecule, such as ethylene glycol with to —OH groups, leveraging the chelating effect when bonded to Sn center.

Figure 4:
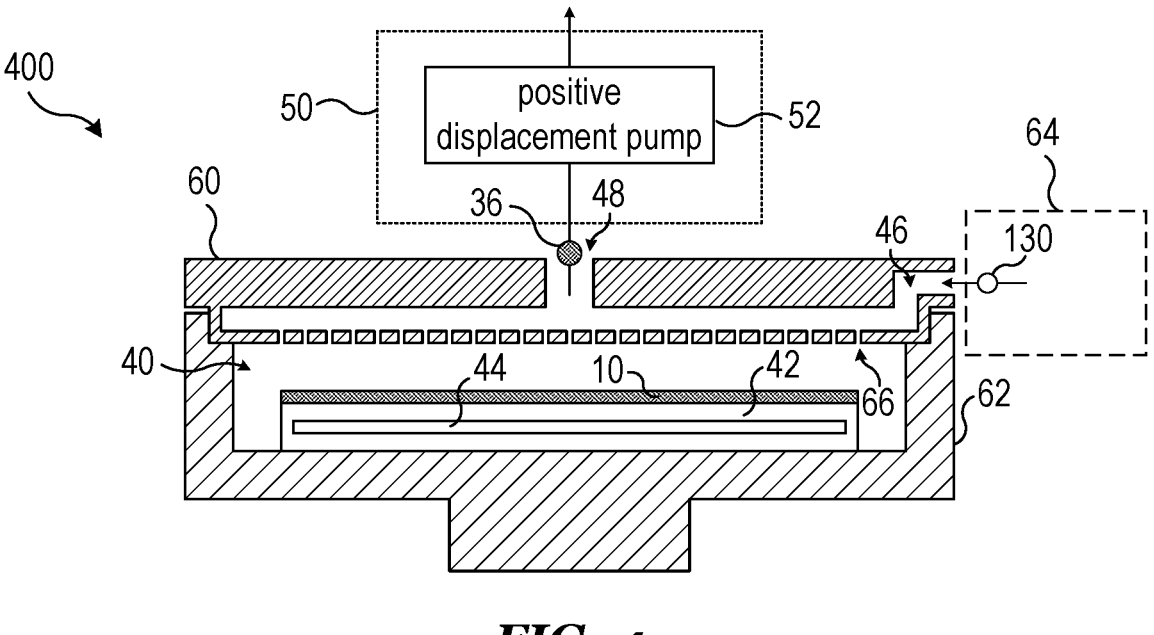
FIG. 4 illustrates an example integrated baking and reactive development apparatus configured to develop a patterned metal oxide resist at a pressure greater than about 1 mTorr in accordance with embodiments of the invention.
Figure 5:
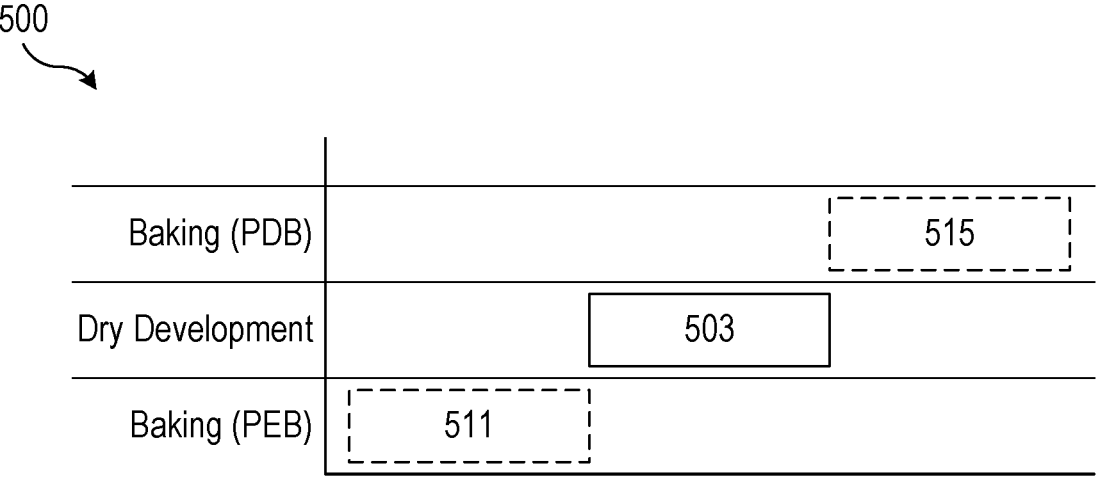
FIG. 5 illustrates an example lithography process flow including a reactive development step combined with a baking step performed in the same processing chamber in accordance with embodiments of the invention.

FIG. 4 illustrates an example integrated baking and reactive development apparatus configured to develop a patterned metal oxide resist at a pressure greater than about 1 mTorr in accordance with embodiments of the invention.

Referring to FIG. 4, an integrated baking and reactive development apparatus 400 includes a vacuum chamber 40 coupled to a pumping system 50 comprising a positive displacement pump 52. The pumping system 50 is configured to operate in vacuum regimes higher than about 1 mTorr (e.g. the medium vacuum regime between about 1 mTorr and about 1 Torr, the low vacuum regime between about 1 Torr and about 500 Torr, or higher such as atmospheric pressure) and advantageously does not require a multistage pumping system. That is, the pumping system 50 does not include any momentum transfer pump or any entrapment pump (which are typically used to achieve high vacuum and beyond).

A hot plate 42 (which may also be an electrostatic chuck that includes or is coupled to a heating element) is also included in the vacuum chamber 40. The hot plate 42 is configured to support and bake a substrate 10 that includes a patterned MOR. The hot plate 42 may also include a heating element 44 (e.g. electrical resistance heating element) or may be heated by some other suitable heating technique. A gas inlet 46 is configured to supply a gaseous developer (e.g. including a gaseous weak acid 130 as shown) to develop the patterned MOR at a pressure greater than about 1 mTorr.

In some embodiments, the vacuum chamber 40 may not include any plasma source that is configured to generate plasma within the vacuum chamber 40. In such configurations, the reactive development process is entirely thermal which may afford various advantages as described herein. The gaseous developer may be sourced from a precursor box 64 coupled to the gas inlet 46 of the vacuum chamber 40 (e.g. the reactive developer may be injected into the vacuum chamber 40 in the gas phase and including a weak acid). Alternatively, a precursor may be sourced from the precursor box into the vacuum chamber 40 and the weak acid may be generated in the vacuum chamber 40 itself from the precursor.

Optionally, a remote plasma source may be coupled to vacuum chamber 40 (e.g. to the precursor box 64) and may be configured to activate the gaseous developer, even for thermal reactive development processes. Alternatively, in certain embodiments, a plasma source may be coupled to the vacuum chamber 40 and configured to generate a plasma within the vacuum chamber 40.

A movable lid 60 is configured to seal the vacuum chamber 40 for operation at low and medium vacuum regimes. The movable lid 60 may also be used for wafer transfer (e.g. for facile insertion and removal of a substrate into and from the vacuum chamber 40). The incorporation of such a movable lid 60 may advantageously be made possible by the relaxed vacuum requirements (e.g. higher pressure) of the reactive developer used in the vacuum chamber 40. The movable lid 60 may be a heated lid in one embodiment. Alternatively or additionally, the vacuum chamber 40 may also include chamber walls 62 that are heated. In some configurations (such as the configuration shown), the movable lid 60 includes the gas inlet 46 and an exhaust port 48 that is coupled to the pumping system 50. The movable lid 60 may also include a gas delivery network 66 such as the showerhead gas deliver network depicted.

The integrated baking and reactive development apparatus 400 may be configured to be integrated into a multitool processing system. For example, the multitool processing system includes multiple chambers and may share a vacuum allowing one or more substrates to be moved between tools without breaking vacuum. The vacuum requirements of the various tools may be similar (e.g. they may all require medium to low vacuum, atmospheric pressure, high vacuum, etc.) In one embodiment, the multitool processing system is a cluster tool. This may have the benefit of allowing greater control over the MOR characteristics via superior control over the queue time and atmosphere.

FIG. 5 illustrates an example lithography process flow including a reactive development step combined with a baking step performed in the same processing chamber in accordance with embodiments of the invention. The lithography process flow 500 may be performed by an integrated tool such as the integrated baking and reactive development apparatus of FIG. 4, for example. Similarly labeled elements may be as previously described.

Referring to FIG. 5, the lithography process flow 500 includes at least one baking phase and a reactive development phase 503 performed in the same processing chamber as the at least one baking phase. This process flow may advantageously improve throughput by consolidating baking steps to the same tool and the development step. The baking phase may include a PEB phase 511 and/or a PDB phase 515. The baking conditions, tool parameter and baking atmosphere, may be the same or different than in the reactive developing step.

As previously mentioned, the reactive developing phase 503 may be performed at a pressure greater than about 1 mTorr (e.g. at a pressure is in the medium vacuum regime between about 1 mTorr and about 1 Torr, the low vacuum regime between about 1 Torr and about 500 Torr, or higher such as at atmospheric pressure). The reactive developing phase 503 may be a thermal process performed at higher temperatures than conventional reactive development processes and with no plasma is generated in the processing chamber. These specifics regarding pressure, temperature, and the lack of plasma may advantageously enable the integration of the baking step(s) with the reactive development of the patterned MOR in in the same tool.

During the reactive development phase 503, the gaseous weak acid may be provided continuously or may be pulsed. Pulsing the gaseous weak acid may have the advantage or allowing volatile compounds to be evacuated from the surface in between pulses.

The expanded temperature range for the reactive development phase 503 may allow increased compatibility with the PEB phase 511 and the PDB phase 515, which may be performed at relatively high temperatures. Temperature ramping may take a long time relative to other processes. Therefore, the similarity in temperature between the baking and development phases may advantageously improve throughput. In one embodiment, the reactive development phase 503 is performed at the same temperate as the PEB phase 511 (performed before the reactive development phase 503). In another embodiment, the reactive development phase 502 is performed at the same temperature as the PDB phase 515 (performed after the reactive development phase 503).

FIG. 6 illustrates a method of reactive developing a metal oxide resist in accordance with embodiments of the invention. The method of FIG. 6 may be combined with other methods and performed using the systems and apparatuses as described herein. For example, the method of FIG. 6 may be combined with any of the embodiments of FIGS. 1-5. Although shown in a logical order, the arrangement and numbering of the steps of FIG. 6 are not intended to be limited. The method steps of FIG. 6 may be performed in any suitable order or concurrently with one another as may be apparent to a person of skill in the art.

Referring to FIG. 6, a method 600 of reactive developing an MOR includes a step 601 of providing a gaseous weak acid to a surface of a patterned MOR. The MOR comprises an exposed portion and an unexposed portion. The gaseous weak acid has an acidity (pK$_a$) greater than –2 and less than about 20. The patterned MOR is reactive developed in step 602 using a selective acid-base reaction between the gaseous weak acid and the patterned MOR to form volatile products. The gaseous weak acid acts as the acid and either the exposed portion or the unexposed portion acts as the base. For example, the exposed portion acts as the base for a positive tone MOR while the unexposed portion acts as the base for the unexposed portion.

FIG. 7 illustrates another method of reactive developing a metal oxide resist in accordance with embodiments of the invention. The method of FIG. 7 may be combined with other methods and performed using the systems and apparatuses as described herein. For example, the method of FIG. 7 may be combined with any of the embodiments of FIGS. 1-6. Although shown in a logical order, the arrangement and numbering of the steps of FIG. 7 are not intended to be limited. The method steps of FIG. 7 may be performed in any suitable order or concurrently with one another as may be apparent to a person of skill in the art.

Referring to FIG. 7, a method 700 of reactive developing an MOR includes a step 701 of providing a gaseous developer to a surface of a patterned MOR. As before, the MORE comprises an exposed portion and an unexposed portion. The gaseous developer comprises an at least partially substituted form of a compound selected from the group consisting of a hydroxyl-containing compound having the formula RO—H with R being an organic group or hydrogen, an aromatic alcohol having the formula ArO—H with Ar being an aromatic compound, an amine having the formula RN—H, and a borane. The MOR is reactive developed in step 702 using a selective acid-base reaction between the gaseous weak acid and the patterned MOR to form volatile products. As before, the gaseous developer acts as the acid and either the exposed portion or the unexposed portion acts as the base.

Example embodiments of the invention are summarized here. Other embodiments can also be understood from the entirety of the specification as well as the claims filed herein.

Example 1. A method of reactive developing a metal oxide resist (MOR) including: providing a gaseous weak acid to a surface of a patterned MOR including an exposed portion and an unexposed portion, the gaseous weak acid having an acidity (pK$_a$) greater than –2 and less than about 20; and reactive developing the patterned MOR using a selective acid-base reaction between the gaseous weak acid and the patterned MOR to form volatile products, the gaseous weak acid acting as the acid and either the exposed portion or the unexposed portion acting as the base.

Example 2. The method of example 1, where the gaseous weak acid includes hydrogen fluoride.

Example 3. The method of example 1, where the gaseous weak acid includes a carboxylic acid having the formula RCOO—H with R being an organic group or hydrogen, an alcohol having the formula RO—H, an aromatic alcohol having the formula ArO—H with Ar being an aromatic compound, or an amine having the formula RN—H.

Example 4. The method of example 1, wherein the gaseous weak acid includes a thiol having the formula RS—H with R being an organic group or hydrogen, an amino acid having the formula R—CH(NH$_2$)COOH, a nitrile having the formula R—CN, a thiocyanic acid having the formula HSCN, hydrogen sulfide (H$_2$S), or hydrogen selenide (H$_2$Se).

Example 5. The method of example 1, where the gaseous weak acid is a Lewis acid including boron and at least one organic substituent from the group consisting of an alkyl group having the formula C$_n$H$_{2n+1}$ with n>1, an alkoxide group having the formula OR with R being an organic group or hydrogen, and an amide group having the formula NR$_x$ with x>0.

Example 6. The method of example 1, where the gaseous weak acid is a Lewis acid including a boron-hydrogen bond and at least one alkyl group substituent.

Example 7. The method of example 1, where the gaseous weak acid is a Lewis acid including B$_y$H$_z$ with y>1 and z>3.

Example 8. A method of reactive developing a metal oxide resist (MOR) including: providing a gaseous developer to a surface of a patterned MOR including an exposed portion and an unexposed portion, the gaseous developer including an at least partially substituted form of a compound selected from the group consisting of a carboxylic acid having the formula RCOO—H with R being an organic group or hydrogen, an alcohol having the formula RO—H, an aromatic alcohol having the formula ArO—H with Ar being an aromatic compound, an amine having the formula RN—H, and a borane; and reactive developing the patterned MOR using a selective acid-base reaction between the gaseous developer and the patterned MOR to form volatile products, the gaseous developer acting as the acid and either the exposed portion or the unexposed portion acting as the base.

Example 9. The method of example 8, where the compound is the hydroxyl-containing compound, the aromatic alcohol, or the amine, and is substituted with a more electronegative substituent.

Example 10. The method of example 9, where the more electronegative substituent is a halogen.

Example 11. The method of example 10, where the compound is acetylacetone (acac) and the halogen is fluorine so that the gaseous developer includes hexafluoroacetylacetone (hfac).

Example 12. The method of example 8, where the compound is a simple alcohol and the gaseous developer includes an at least partially substituted simple alcohol with at least one halogen substituent.

Example 13. The method of example 12, where the gaseous developer includes a fluorinated ethanol.

Example 14. The method of example 13, where the gaseous developer includes trifluoroethanol.

Example 15. The method of example 12, where the gaseous developer includes a fluorinated propanol.

Example 16. The method of example 15, where the gaseous developer includes hexafluoroisopropanol.

Example 17. The method of example 8, where the compound is a higher order borane having the formula B$_x$H$_y$ with x>2 and y>0.

Example 18. The method of one of examples 3 to 10 where the number of carbon atoms in R is in the range of 1 to 11 carbon atoms.

Example 19. The method of one of examples 1 and 3 to 18, where the gaseous weak acid is noncorrosive.

Example 20. The method of one of examples 1 to 19, where reactive developing the patterned MOR includes reactive developing the patterned MOR in a processing chamber at a pressure greater than about 1 mTorr.

Example 21. The method of example 20, where the pressure is in the medium vacuum regime between about 1 mTorr and about 1 Torr.

Example 22. The method of one of examples 1 to 21, where reactive developing the patterned MOR is a thermal process performed in a processing chamber with no plasma generated in the processing chamber.

Example 23. The method of example 22, where the gaseous weak acid is activated using a remote plasma generated in a precursor chamber coupled to the processing chamber.

Example 24. The method of one of examples 1 to 23, where reactive developing the patterned MOR includes generating a plasma in a processing chamber.

Example 25. The method of one of examples 1 to 24, where reactive developing the patterned MOR is performed at a temperature greater than 300° C. and less than about 400° C.

Example 26. The method of one of examples 1 to 24, where reactive developing the patterned MOR is performed at a temperature less than 0° C. and greater than about −70° C.

Example 27. The method of one of examples 1 to 26, further including: baking the patterned MOR in a processing chamber, where reactive developing the patterned MOR is performed in the same processing chamber.

Example 28. The method of example 27, where baking the patterned MOR is performed as a post exposure bake (PEB) before reactive developing the patterned MOR.

Example 29. The method of example 28, where reactive developing the patterned MOR is performed at the same temperature as the PEB.

Example 30. The method of example 27, where baking the patterned MOR is performed as a post development bake (PDB) after reactive developing the patterned MOR.

Example 31. The method of example 30, where reactive developing the patterned MOR is performed at the same temperature as the PDB.

Example 32. The method of one of examples 1 to 31, further including: reactive developing the patterned MOR using a gaseous strong acid.

Example 33. The method of example 32, where the gaseous strong acid is a mineral acid.

Example 34. The method of example 33, where the mineral acid is HBr.

Example 35. The method of one of examples 1 to 34, where providing the gaseous weak acid to the surface of the patterned MOR includes: introducing a precursor into a processing chamber containing the patterned MOR; and generating the gaseous weak acid in the processing chamber from the precursor.

Example 36. The method of one of examples 1 to 34, where providing the gaseous weak acid to the surface of the patterned MOR includes injecting the gaseous weak acid into a processing chamber.

Example 37. The method of one of examples 1 to 36, where providing the gaseous weak acid to the surface of the patterned MOR includes pulsing the gaseous weak acid.

Example 38. The method of one of examples 1 to 36, where providing the gaseous weak acid to the surface of the patterned MOR includes continuously supplying the gaseous weak acid.

Example 39. The method of one of examples 1 to 38, where the MOR is a positive tone resist.

Example 40. The method of one of examples 1 to 38, where the MOR is a negative tone resist.

Example 41. An integrated baking and reactive development apparatus including: a vacuum chamber coupled to a pumping system including a positive displacement pump, the pumping system including no momentum transfer pump or entrapment pump; a hot plate configured to bake a substrate including a patterned metal oxide resist (MOR);

and a gas inlet configured to supply a gaseous developer to develop the patterned MOR at a pressure greater than about 1 mTorr.

Example 42. The integrated baking and reactive development apparatus of example 41, where the vacuum chamber includes no plasma source configured to generate plasma within the vacuum chamber.

Example 43. The integrated baking and reactive development apparatus of one of examples 41 and 42, further including a remote plasma source coupled to the vacuum chamber and configured to activate the gaseous developer.

Example 44. The integrated baking and reactive development apparatus of example 43, where the remote plasma source is coupled to a precursor box coupled to the gas inlet.

Example 45. The integrated baking and reactive development apparatus of one of examples 41 to 44, further including: a plasma source coupled to the vacuum chamber and configured to generate a plasma within the vacuum chamber.

Example 46. The integrated baking and reactive development apparatus of one of examples 41 to 45, further including: a movable lid configured to seal the vacuum chamber for operation at low and medium vacuum regimes.

Example 47. The integrated baking and reactive development apparatus of example 46, where the movable lid is a heated lid.

Example 48. The integrated baking and reactive development apparatus of one of examples 46 and 47, where the movable lid includes the gas inlet and an exhaust port coupled to the pumping system.

Example 49. The integrated baking and reactive development apparatus of example 48, where the movable lid includes a showerhead gas delivery network.

Example 50. The integrated baking and reactive development apparatus of one of examples 41 to 49, where the vacuum chamber includes heated chamber walls.

Example 51. The integrated baking and reactive development apparatus of example 41, where the integrated baking and reactive development apparatus is configured to be integrated into a multitool processing system.

Example 52. The integrated baking and reactive development apparatus of example 51, where the multitool processing system includes multiple chambers within a shared vacuum.

Example 53. The baking and reactive development apparatus of example 52, where the multitool processing system is a cluster tool.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of reactive developing a metal oxide resist (MOR) during a semiconductor manufacturing process, the method comprising:

providing a gaseous weak acid to a surface of a patterned MOR comprising an exposed portion and an unexposed portion, the gaseous weak acid having an acidity ($pK_a$) greater than −2 and less than about 20, the gaseous weak acid comprising a compound selected from the group consisting of an alcohol having an organic group comprising a saturated carbon bonded to a hydroxyl group, an amine having a nitrogen bonded to an organic group and hydrogen, and a Lewis acid comprising boron and at least one organic substituent from the group consisting of an alkyl group having the formula $C_nH_{2n+1}$ with n>1, an alkoxide group having an alkyl bonded to an oxygen, and an amide group having a nitrogen bonded to one or two organic substituents; and reactive developing the patterned MOR using a selective acid-base reaction between the gaseous weak acid and the patterned MOR to form volatile products, the gaseous weak acid acting as the acid and either the exposed portion or the unexposed portion acting as the base.

2. The method of claim 1, wherein the compound is an aromatic alcohol having the formula ArO—H with Ar being an aromatic compound.

3. The method of claim 1, wherein the compound is the Lewis acid and comprises a boron-hydrogen bond and at least one alkyl group substituent.

4. The method of claim 1, wherein reactive developing the patterned MOR comprises reactive developing the patterned MOR in a processing chamber at a pressure greater than about 1 mTorr.

5. The method of claim 1, wherein reactive developing the patterned MOR is a thermal process performed in a processing chamber with no plasma generated in the processing chamber.

6. The method of claim 1, further comprising:

baking the patterned MOR in a processing chamber, wherein reactive developing the patterned MOR is performed in the same processing chamber.

7. A method of reactive developing a metal oxide resist (MOR) during a semiconductor manufacturing process, the method comprising:

providing a gaseous developer to a surface of a patterned MOR comprising an exposed portion and an unexposed portion, the gaseous developer comprising an at least partially substituted form of a compound selected from the group consisting of an alcohol having an organic group comprising a saturated carbon bonded to a hydroxyl group, an aromatic alcohol having the formula ArO—H with Ar being an aromatic compound, and an amine having a nitrogen bonded to an organic group and hydrogen; and reactive developing the patterned MOR using a selective acid-base reaction between the gaseous developer and the patterned MOR to form volatile products, the gaseous developer acting as the acid and either the exposed portion or the unexposed portion acting as the base.

8. The method of claim 7, wherein the compound is substituted with a more electronegative substituent.

9. The method of claim 8, wherein the more electronegative substituent is a halogen.

10. The method of claim 7, wherein the compound is the alcohol at least partially substituted with at least one halogen substituent.

11. The method of claim 1, wherein the compound is an at least partially substituted simple alcohol with at least one halogen substituent.

12. The method of claim 11, wherein the compound is a fluorinated alcohol.

13. The method of claim 9, wherein the compound is an at least partially substituted simple alcohol.

14. The method of claim 13, wherein the compound is a fluorinated alcohol.

15. A method of reactive developing a metal oxide resist (MOR) comprising:

providing a gaseous alcohol having an organic group comprising a saturated carbon bonded to a hydroxyl group to a surface of a patterned MOR comprising an exposed portion and an unexposed portion; and reactive developing the patterned MOR using a selective acid-base reaction between the gaseous alcohol and the patterned MOR to form volatile products, the gaseous alcohol acting as the acid and either the exposed portion or the unexposed portion acting as the base.

16. The method of claim 15, wherein the gaseous alcohol is a simple alcohol.

17. The method of claim 16, wherein the simple alcohol is at least partially substituted with at least one halogen substituent.

18. The method of claim 17, wherein the simple alcohol is a fluorinated ethanol.

19. The method of claim 17, wherein the simple alcohol is a fluorinated propanol.

20. The method of claim 15, wherein the gaseous alcohol is an aromatic alcohol having the formula ArO—H with Ar being an aromatic compound.

* * * * *